United States Patent [19]
Lee et al.

[11] Patent Number: 6,108,244
[45] Date of Patent: Aug. 22, 2000

[54] SYNCHRONOUS MEMORY DEVICES HAVING DUAL PORT CAPABILITY FOR GRAPHICS AND OTHER APPLICATIONS

[75] Inventors: Ho-cheol Lee; Kyung-woo Nam, both of Seoul, Rep. of Korea

[73] Assignee: Samsung Electronics Co., Ltd., Rep. of Korea

[21] Appl. No.: 09/384,867

[22] Filed: Aug. 27, 1999

[30] Foreign Application Priority Data

Sep. 1, 1998 [KR] Rep. of Korea .................. 98-35853

[51] Int. Cl.$^7$ ............................................. G11C 7/00
[52] U.S. Cl. ................................ 365/189.05; 365/233
[58] Field of Search ............................ 365/189.05, 233

[56] References Cited

U.S. PATENT DOCUMENTS

| | | | |
|---|---|---|---|
| 4,344,131 | 8/1982 | Girard | 364/200 |
| 4,485,414 | 11/1984 | Baker | 360/10.3 |
| 5,307,324 | 4/1994 | Nishimoto | 365/233.5 |

FOREIGN PATENT DOCUMENTS 2 246 044   1/1992   United Kingdom .

*Primary Examiner*—David Nelms
*Assistant Examiner*—M. Tran
*Attorney, Agent, or Firm*—Myers Bigel Sibley & Sajovec

[57] ABSTRACT

Graphics memory devices include an output register having an input electrically coupled to an output signal line (DO) and first and second data output buffers responsive to first and second clock signals (CLK1, CLK2), respectively. The first data output buffer has an input electrically coupled to the output signal line (DO) and the second data output buffer has an input electrically coupled to an output of the output register. These memory devices also include at least one memory cell array and a read data driver that has an input electrically coupled to the memory cell array by an input/output signal line (I/O) and an output electrically coupled to the output signal line (DO). To provide improved performance for graphics processing applications, a clock signal generator is provided that generates the first and second clock signals at different frequencies and/or different phases relative to each other. The second clock signal is preferably generated at a higher frequency than the first clock signal so that data (e.g., screen refresh data) provided by the read data driver to the output register can be serially transmitted from the second data output buffer at a high data rate. This data can also be transmitted in parallel with data being transmitted from the first data output buffer. In particular, the first data output buffer generates data at its output (first port) in response to a rising or falling edge of the first clock signal, but the second data output buffer generates data at its output (second port) in response to rising and falling edges of the second clock signal. Thus, even if the first and second clock signals have the same frequency, the rate of data being transmitted by the second data output buffer can be higher than the rate of data being transmitted by the first data output buffer.

14 Claims, 2 Drawing Sheets

SYNCHRONOUS MEMORY DEVICES HAVING DUAL PORT CAPABILITY FOR GRAPHICS AND OTHER APPLICATIONS

RELATED APPLICATION

This application is related to Korean Application No. 98-35853, filed Sep. 1, 1998, the disclosure of which is hereby incorporated herein by reference.

FIELD OF THE INVENTION

The present invention relates to integrated circuit devices, and more particularly to integrated circuit memory devices.

BACKGROUND OF THE INVENTION

In addition to reading and writing operations, graphics memory devices generally perform screen refresh operations. Because of this additional functionality, graphics memory devices typically must operate at higher operating speeds than traditional memory devices. To meet these speed demands, high-speed synchronous DRAM devices have frequently been used for graphics memory applications. For example, FIG. 1 is a block diagram of a conventional synchronous DRAM device. In this device, a memory cell array 11 is provided along with a write driver 13 and a read driver 17. A data input buffer 15 is also provided in addition to a data output buffer 19. These buffers are generally responsive to a single clock signal CLK.

In particular, during a write operation, data received at a data port DQ is buffered by the data input buffer 15. This data is then transferred to a data input line DI by the data input buffer 15. This transfer operation is performed in-sync with the clock signal CLK. The write driver 13 then drives an input/output line I/O with the data so that the data can be written into the memory cell array 11 using conventional techniques. As illustrated by FIGS. 1–2, after receipt of a read command, read data is transferred from the memory cell array 11 to the read driver 17. The read driver 17 then drives the data output line DO with the read data. The data output buffer 19 buffers the read data and passes the read data to the data port DQ in-sync with each rising edge of the clock signal CLK.

In order to improve the operating speed of such synchronous DRAM devices, Dual Data Rate (DDR) synchronous DRAM devices have been developed. To achieve higher operating frequencies, such devices typically include output buffers that transmit read data to a single output port in-sync with both rising and falling edges of the clock signal. Notwithstanding this higher rate of data transmission, the use of a single output port may limit the ability of DDR DRAM devices to function adequately as graphics memory devices since screen refresh operations may also need to be performed via the single port in addition to normal reading and writing operations. Conventional dual-port memory devices, such as Extended Data Out (EDO) memory devices, typically perform data input and output operations in parallel through two ports. Unfortunately, because such devices typically operate at relatively low frequencies, they also may not be suitable for graphics memory device applications. Thus, notwithstanding the above described memory devices, there continues to be a need for integrated circuit memory devices that can provide improved performance and are more suitable for graphics memory applications.

SUMMARY OF THE INVENTION

It is therefore an object of the present invention to provide integrated circuit memory devices that can be suitable for high speed graphics applications.

These and other objects, advantages and features of the present invention can be provided by integrated circuit memory devices that include an output register having an input electrically coupled to an output signal line (DO) and first and second data output buffers responsive to first and second clock signals (CLK1, CLK2), respectively. The first data output buffer has an input electrically coupled to the output signal line (DO) and the second data output buffer has an input electrically coupled to an output of the output register. These memory devices also include at least one memory cell array and a read data driver that has an input electrically coupled to the memory cell array by an input/output signal line (I/O) and an output electrically coupled to the output signal line (DO).

To provide improved performance for graphics processing applications, a clock signal generator is provided that generates the first and second clock signals at different frequencies and/or different phases relative to each other. The second clock signal is preferably generated at a higher frequency than the first clock signal so that data (e.g., screen refresh data) provided by the read data driver to the output register can be serially transmitted from the second data output buffer at a high data rate. This data can also be transmitted in parallel with data being transmitted from the first data output buffer. In particular, the first data output buffer generates data at its output (first port) in response to a rising or falling edge of the first clock signal, but the second data output buffer generates data at its output (second port) in response to rising and falling edges of the second clock signal. Thus, even if the first and second clock signals have the same frequency, the rate of data being transmitted by the second data output buffer can be higher than the rate of data being transmitted by the first data output buffer.

The preferred memory device also preferably includes a data input buffer having an input electrically coupled to an output of the first data output buffer and a write driver having an input electrically coupled to an output of the data input buffer and an output electrically coupled to the memory cell array.

Based on these aspects of the present invention, high speed dual port operation can be achieved. In particular, operations to write and read data (e.g., graphics data) can be performed through the first port in sync with a first clock signal. Simultaneously with these operations, operations to read additional data (e.g., screen refresh data) can be performed through the second port at high speed since both the rising and falling edges of the clock signal can be used to trigger the transmission of data from the second data output buffer.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
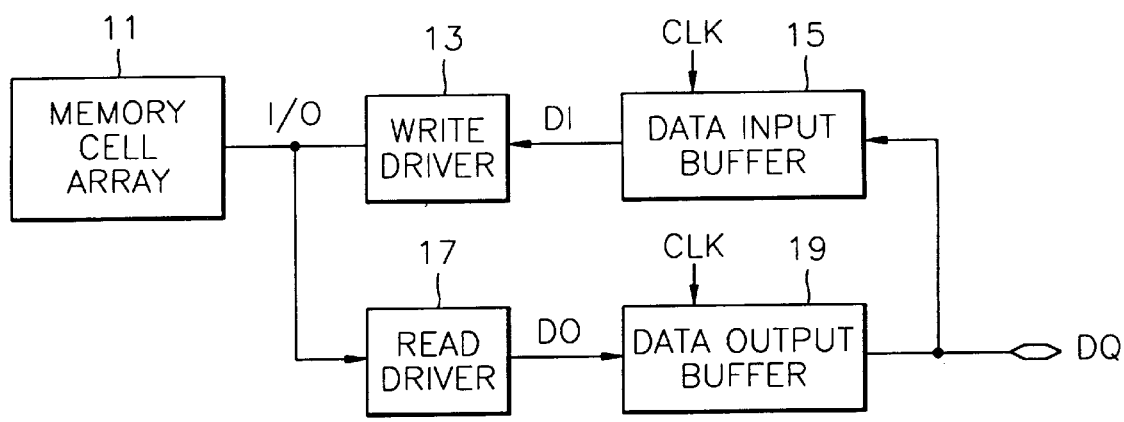
FIG. 1 is a block diagram of an integrated circuit memory device according to the prior art.
Figure 2:
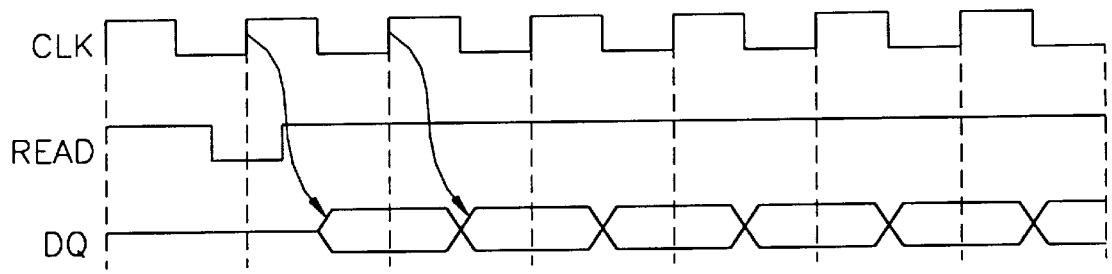
FIG. 2 is a timing diagram that illustrates operation of the memory device of FIG. 1.
Figure 3:
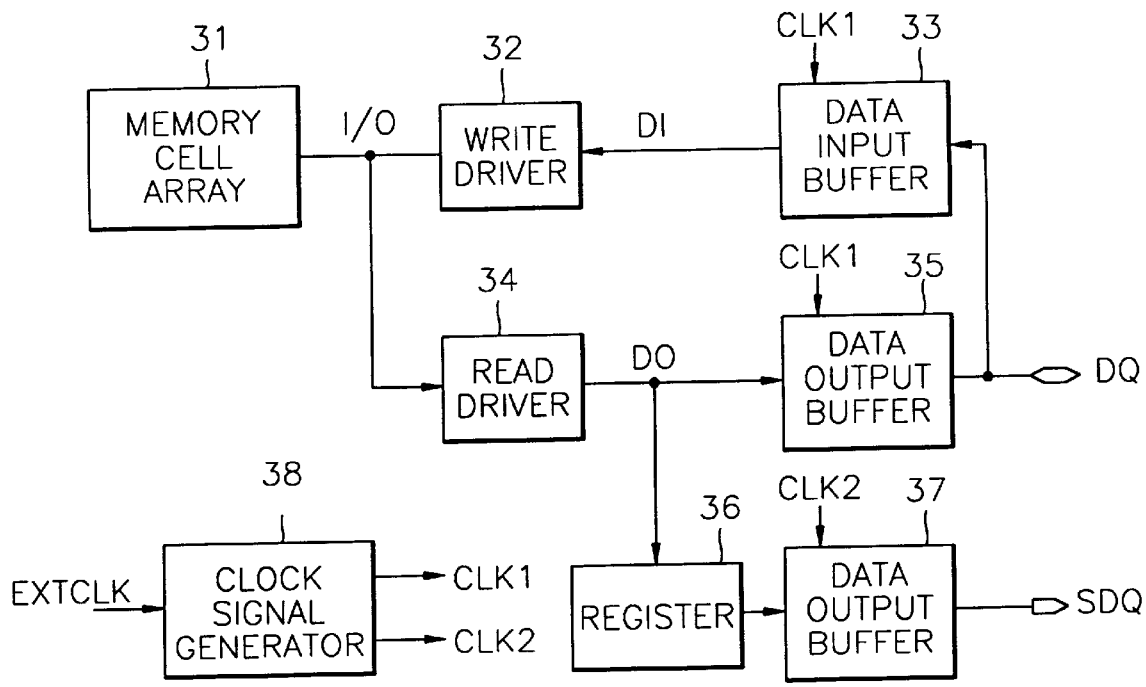
FIG. 3 is a block diagram of an integrated circuit memory device according to a first embodiment of the present invention.
Figure 4:
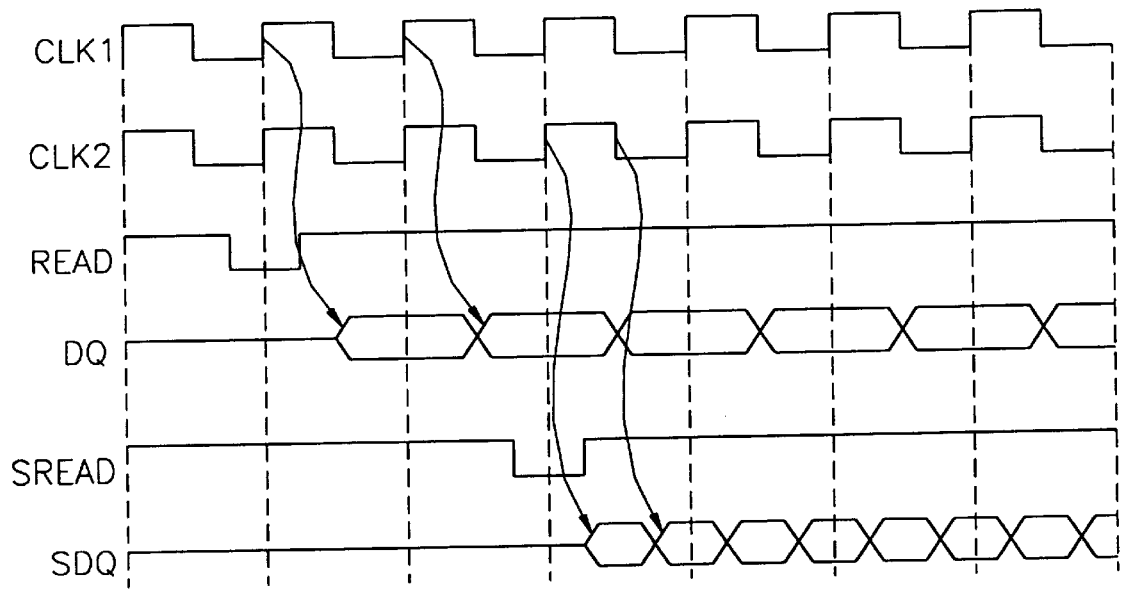
FIG. 4 is a timing diagram that illustrates operation of the memory device of FIG. 3.

Referring now to FIGS. 3–4, a preferred integrated circuit memory device according to a first embodiment of the present invention will be described. In particular, the preferred memory device includes a memory cell array 31 (e.g., SDRAM array), a write driver 32 and a read driver 34. As illustrated, the write driver 32 receives "write" data on a data input signal line (DI) and transfers this data to the memory cell array 31 via at least one input/output signal line I/O. Alternatively, the read driver 34 receives "read" data from the memory cell array 31 and drives a data output signal line (DO) with this data. The memory cell array 31, write driver 32 and read driver 34 may be of conventional design.

A data input buffer 33 is also provided. The data input buffer 33 receives data from a first port (DQ) and transmits this data to the data input signal line (DI) in-sync with a first clock signal (CLK1). First and second data output buffers 35 and 37 are also provided along with an output register 36. The first data output buffer 35 receives data from the data output signal line (DO) and transmits this data to the first port (DQ) in-sync with the first clock signal (CLK1). In contrast, the output register 36 stores data received from the data output signal line (DO) and transfers this data to the second data output buffer 37. The second data output buffer 37 transmits the data received from the output register 36 to the second port (SDQ) in-sync with both rising and falling edges of the second clock signal (CLK2). The second clock signal (CLK2) may have a higher frequency than the first clock signal (CLK1) and/or may be out-of-phase relative to the first clock signal (CLK1). The first and second clock signals CLK1 and CLK2 are generated by a clock signal generator 38 which may be responsive to an external clock signal EXTCLK. Alternatively, the clock signal generator 38 may be external to the integrated circuit memory device. As explained more fully hereinbelow, the data transmitted to the second port (SDQ) can comprise screen refresh data that is temporarily stored in the output register 36. In addition, operations to transmit data to the second port can be performed in parallel with operations to transmit data from the first data output buffer to the first port (or receive data from first port DI into the data input buffer 33).

During a write operation (after row activation), the data input buffer 33 buffers input data received form the first port DQ and transfers this data to the data input signal line (DI) in synchronization with the rising edges of the first clock signal CLK1. The write driver 32 receives the input data from the data input buffer 33 and drives the input/output signal line I/O with the input data. The input data received by the input/output signal line I/O is then written into the memory cell array 31 using conventional techniques.

During a read operation (after row activation), read data from the memory cell array 31 is transferred to the input/output signal line I/O.

The read driver 34 receives the read data and then drives the data output signal line DO with the read data. The first data output buffer 35, which may be synchronized with the rising edges of the first clock signal CLK1, buffers the read data and passes the buffered read data to the first port DQ. However, if an operation for reading data from the second port SDQ is received (after row activation), then the output register 36 (which can be serially accessed) can be controlled to receive data from the data output signal line. The output register 36 can also be controlled to pass the stored data therein to the second output buffer 37. Then, in response to both rising and falling edges of the second clock signal CLK2, the second output buffer 37 passes the data to the second port SDQ. Accordingly, even if the second clock signal CLK2 has the same frequency as the first clock signal CLK1, the rate at which data can be passed to the second port SDQ exceeds the rate at which data can be passed from the first data output buffer 35 to the first port DQ by a factor of two. To compensate for this higher data rate, at least twice as much data is typically prefetched from the memory cell array 31 when the second port SDQ is being accessed.

Referring now to FIG. 4, a timing diagram is provided that illustrates operation of the device of FIG. 3 when both the first clock CLK1 and second clock CLK2 have the same frequency and are in phase with each other. As illustrated, a "first port" read command (READ) causes read data to arrive at the first port DQ in-sync with rising edges of the first clock CLK1. However, a "second port" read command (SREAD) causes read data to arrive at the second port DQ in-sync with both rising and falling edges of the second clock CLK2.

Thus, if a memory device according to the present invention is used as a graphics memory device, a read operation to retrieve picture data stored within the memory cell array 31 results in the generation of the picture data at the first port DQ. However, if the memory device is also undergoing or preparing for a screen refresh operation, refresh data can be read from the memory cell array 31 and stored in the output register 36. This refresh data can then be output to the second port SDQ at a high data rate since both rising and falling edges of the second clock CLK2 trigger the transfer of data through the second data output buffer 37. Moreover, by using separate clocks, data can be transferred simultaneously to the first and second ports or data can be received by the first data port DQ during a write operation while data is being output to the second data port SDQ during a refresh operation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
    an output register having an input electrically coupled to an output signal line; and
    first and second data output buffers responsive to first and second clock signals, respectively, said first data output buffer having an input electrically coupled to the output signal line and said second data output buffer having an input electrically coupled to an output of said output register.

2. An integrated circuit memory device, comprising:
    an output register having an input electrically coupled to an output signal line;
    first and second data output buffers responsive to first and second clock signals, respectively, said first data output buffer having an input electrically coupled to the output signal line and said second data output buffer having an input electrically coupled to an output of said output register;

a memory cell array; and a read data driver having an input electrically coupled to said memory cell array and an output electrically coupled to said output signal line.

3. The memory device of claim 2, further comprising:

a clock signal generator that generates the first and second clock signals at different frequencies and/or different phases relative to each other.

4. The memory device of claim 2, further comprising:

a data input buffer having an input electrically coupled to an output of said first data output buffer; and a write driver having an input electrically coupled to an output of said data input buffer and an output electrically coupled to said memory cell array.

5. The memory device of claim 4, wherein said first data output buffer generates data at its output in response to a rising or falling edge of the first clock signal; and wherein said second data output buffer generates data at its output in response to rising and falling edges of the second clock signal.

6. An integrated circuit memory device, comprising:

an output register having an input electrically coupled to an output signal line; and first and second data output buffers responsive to first and second clock signals, respectively, said first data output buffer having an input electrically coupled to the output signal line and said second data output buffer having an input electrically coupled to an output of said output register;

wherein said first data output buffer generates data at its output in response to a rising or falling edge of the first clock signal; and wherein said second data output buffer generates data at its output in response to rising and falling edges of the second clock signal.

7. The memory device of claim 3, further comprising:

a data input buffer having an input electrically coupled to an output of said first data output buffer; and a write driver having an input electrically coupled to an output of said data input buffer and an output electrically coupled to said memory cell array.

8. The memory device of claim 4, wherein said first data output buffer generates data at its output in response to a rising or falling edge of the first clock signal; and wherein said second data output buffer generates data at its output in response to rising and falling edges of the second clock signal.

9. An integrated circuit memory device, comprising:

a memory cell array;

a first data output buffer that generates data read from said memory cell array at a first data rate, in response to either a rising or falling edge of a first clock signal; and a second data output buffer that generates data read from said memory cell array at a second data rate, in response to both rising and falling edges of a second clock signal having a different frequency and/or different phase relative to the first clock signal.

10. The memory device of claim 9, further comprising:

an output register having an input electrically coupled to an output signal line; and a read data driver having an input electrically coupled to said memory cell array and an output electrically coupled to the output signal line.

11. The memory device of claim 10, wherein said first data output buffer has an input electrically coupled to the output signal line; and wherein said second data output buffer has an input electrically coupled to an output of said output register.

12. The memory device of claim 11, further comprising:

a clock signal generator that generates the first and second clock signals at different frequencies and/or different phases relative to each other.

13. The memory device of claim 11, further comprising:

a data input buffer having an input electrically coupled to an output of said first data output buffer; and a write driver having an input electrically coupled to an output of said data input buffer and an output electrically coupled to said memory cell array.

14. An integrated circuit memory device, comprising:

a memory cell array;

means, communicatively coupled to said memory cell array, for generating data read from said memory cell array at a first data rate, in response to either a rising or falling edge of a first clock signal; and means, communicatively coupled to said memory cell array, for generating data read from said memory cell array at a second data rate, in response to both rising and falling edges of a second clock signal having a different frequency and/or different phase relative to the first clock signal.

* * * * *